(12) United States Patent
Lin

(10) Patent No.: US 6,297,554 B1
(45) Date of Patent: Oct. 2, 2001

(54) DUAL DAMASCENE INTERCONNECT STRUCTURE WITH REDUCED PARASITIC CAPACITANCE

(75) Inventor: Min-Yi Lin, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/522,931

(22) Filed: Mar. 10, 2000

(51) Int. Cl.[7] .................................................. H01L 23/48
(52) U.S. Cl. ............................ 257/752; 257/758; 257/759
(58) Field of Search ..................................... 438/637, 619, 438/622, 623, 421; 257/758, 759, 410, 522, 752

(56) References Cited

U.S. PATENT DOCUMENTS

| | | | |
|---|---|---|---|
| 5,548,159 | * | 8/1996 | Jeng ....................................... 257/634 |
| 5,744,865 | * | 4/1998 | Jeng et al. ............................ 257/750 |
| 5,814,555 | * | 9/1998 | Bandyopadhyay et al. ......... 438/619 |
| 5,847,464 | * | 12/1998 | Singh et al. .......................... 257/752 |
| 6,022,802 | * | 12/2000 | Jang ...................................... 438/656 |
| 6,025,260 | * | 2/2000 | Lien et al. ............................ 438/619 |
| 6,077,767 | * | 6/2000 | Hwang ................................. 438/619 |
| 6,090,698 | * | 7/2000 | Lee ....................................... 438/619 |
| 6,091,149 | * | 7/2000 | Hause et al. ......................... 257/758 |
| 6,159,842 | * | 12/2000 | Chang et al. ........................ 438/622 |
| 6,159,845 | * | 12/2000 | Yew et al. ............................ 438/637 |

* cited by examiner

Primary Examiner—Eddie Lee
Assistant Examiner—Lourdes Cruz
(74) Attorney, Agent, or Firm—Winston Hsu

(57) ABSTRACT

An improved structure of a dielectric layer between two adjacent copper wiring lines is disclosed. The dielectric layer is composed of silicon oxide and the adjacent copper wiring lines are formed using a dual damascene process. The structure of the dielectric layer according to the present invention comprises at least one trench in the surface of the dielectric layer, an insulating layer in the trench and at least one void in the insulating layer. The void is used to reduce the effective dielectric constant as well as the parasitic capacitance of the dielectric layer.

9 Claims, 4 Drawing Sheets

DUAL DAMASCENE INTERCONNECT STRUCTURE WITH REDUCED PARASITIC CAPACITANCE

BACKGROUND OF THE INVENTION

1. Field of the Invention

The present invention relates to the structure of a dielectric layer between two adjacent wiring lines. More particularly, the invention relates to the structure of a dielectric layer that can reduce the parasitic capacitance between two coplanar copper wiring lines.

2. Description of the Prior Art

Resistance-capacitance (RC) time delay is a phenomenon that is caused by adjacent metallic wiring lines in which each line is carrying an electric current, and it is a serious problem in multi-level metalization processes for manufacturing integrated circuits (IC). RC time delays usually lead to reduced response and poor electrical performance of an IC. The response and performance become worse as the spacing between two adjacent metallic wiring lines decreases.

RC time delay is a product of the resistance R of the metallic wiring lines and the parasitic capacitance C formed between them. Minimal RC time delays are desirable. In essence, there are two approaches to reduce RC time delay: a) using conductive materials with a lower resistance as a wiring line or, b) reducing the parasitic capacitance.

Obviously, copper is a good choice owing to its low resistance (1.67 $\mu\Omega$-cm) instead of Al—Cu(5%) alloy which is mostly commonly used in current multilevel metalization processes. However, with the ever-increasing demand on performance, changing the metallic material appears to be inadequate to support future requirements. Consequently, some organic dielectric materials with low dielectric constants, such as polyimide (PI) and HSQ (hydrogen silsequioxane) etc., are rapidly coming into use to reduce parasitic capacitance. Unfortunately, most organic dielectric materials have metal adhesion issues and stability problems in a thermal environment.

SUMMARY OF THE INVENTION

It is therefore a primary objective of this invention to provide an improved structure of a dielectric layer between adjacent copper wiring lines to reduce the parasitic capacitance between them, thereby alleviating RC time delays.

According to this invention, the structure of a dielectric layer made of silicon oxide is defined. The structure lies between adjacent coplanar copper wiring lines on a semiconductor wafer. The copper wiring lines are formed in the dielectric layer using a well-known dual damascene process. The structure of the dielectric layer according to this invention comprises at least one trench in the surface of the dielectric layer, an insulating layer in the trench and at least one void in the insulating layer. The void is used to reduce the effective dielectric constant of the dielectric layer so as to reduce the parasitic capacitance between the two adjacent copper wiring lines.

According to one aspect of this invention, the structure of the dielectric layer between the two adjacent copper wiring lines comprises at least one trench with an aspect ratio greater than 3.5. At least one void is in the insulating layer of the trench. The effective dielectric constant is significantly reduced since the relative dielectric constant of air in the void is approximately 1.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
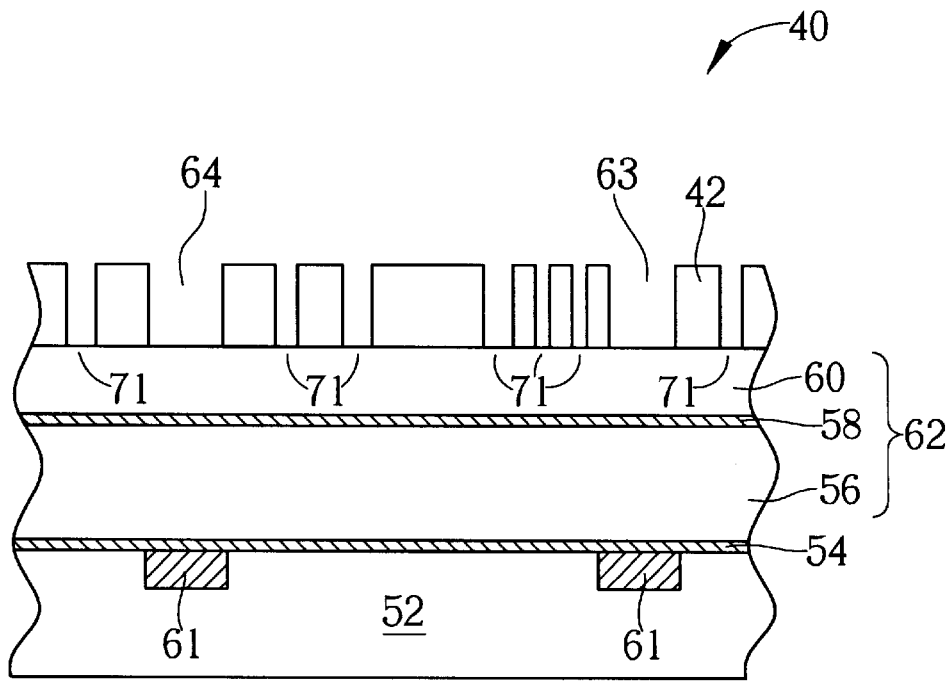
FIG. 1 is a cross-sectional view of the present invention before a series of method steps are performed, but after a conventional CVD process has been performed for the deposition of the silicon oxide, etching stop and dielectric layers.

Please refer to FIG. 1 to FIG. 8. FIG. 1 to FIG. 8 are cross-sectional diagrams of the method of fabricating a structure of a dielectric layer 60 between adjacent cupric wiring lines 91, 92, 93 on a semiconductor wafer 40 according to the present invention. As shown in FIG. 1, the semiconductor wafer 40 comprises a silicon substrate (not shown), a dielectric layer 52 covering the silicon substrate, a plurality of metallic conductors 61 in the dielectric layer 52, a silicon nitride layer 54 covering the dielectric layer 52, and a stacked dielectric layer 62 covering the silicon nitride layer 54. The silicon substrate and the semiconductor devices are not particularly germane to the present invention, and are omitted from further discussion for the sake of clarity.

In this preferred embodiment according to the present invention, the dielectric layer 52 is composed of silicon dioxide and is formed on the surface of the semiconductor wafer 40 using a plasma-enhanced chemical vapor deposition (PECVD) process. In other embodiments, phosphosilicate glass (PSG) or borophosphosilicate glass (BPSG) can also be used.

In accordance with the present invention, the metallic conductors 61 are composed of copper. In order to form the metallic conductors 61 in the dielectric layer 52, the trench pattern of the metallic conductors 61 is first defined by a conventional lithographic process and an anisotropic dry etching process. A known Cu electro-deposition technique is then used to deposit a copper layer in the trench pattern and on the surface of the dielectric layer 52. A chemical mechanical polishing (CMP) process is next performed to complete the copper conductors 61 that are flush with the surface of the dielectric layer 52.

Since copper ions rapidly diffuse through silicon and silicon oxide, causing damage to semiconductor components, a silicon nitride layer 54 is formed on the exposed surface of the copper conductors 61 and the surface of the dielectric layer 52. The silicon nitride layer 54 acts as a passivation layer and is formed using a conventional chemical vapor deposition (CVD) process. The densified silicon nitride layer 54 is effective at preventing diffusion of copper, and it also prevents the copper conductors 61 from oxidizing. It should be noted that the silicon nitride layer 54 should be as thin as possible since the high dielectric constant of silicon nitride will increase parasitic capacitance.

As shown in FIG. 1, patterns of the via holes 63, 64 and trenches 71 have been defined in a photoresist layer 42 over the stacked dielectric layer 62 using a conventional lithographic process. The stacked dielectric layer 62 has an oxide-nitride-oxide (ONO) sandwich structure that is usually used as an inter-metal dielectric layer (IMD layer) in the copper dual damascene process. The stacked dielectric layer 62 comprises a silicon oxide layer 56 with a thickness of about 7000 Å, an etching stop layer 58 with a thickness of about 300 Å covering the silicon oxide layer 56, and a dielectric layer 60, preferably composed of silicon oxide with a thickness of about 5000 Å, covering the etching stop layer 58. The silicon oxide layer 56, the etching stop layer 58 and the dielectric layer 60 are all deposited using a conventional chemical vapor deposition (CVD) process, such as a plasma-enhanced chemical vapor deposition (PECVD) process.

Figure 2:
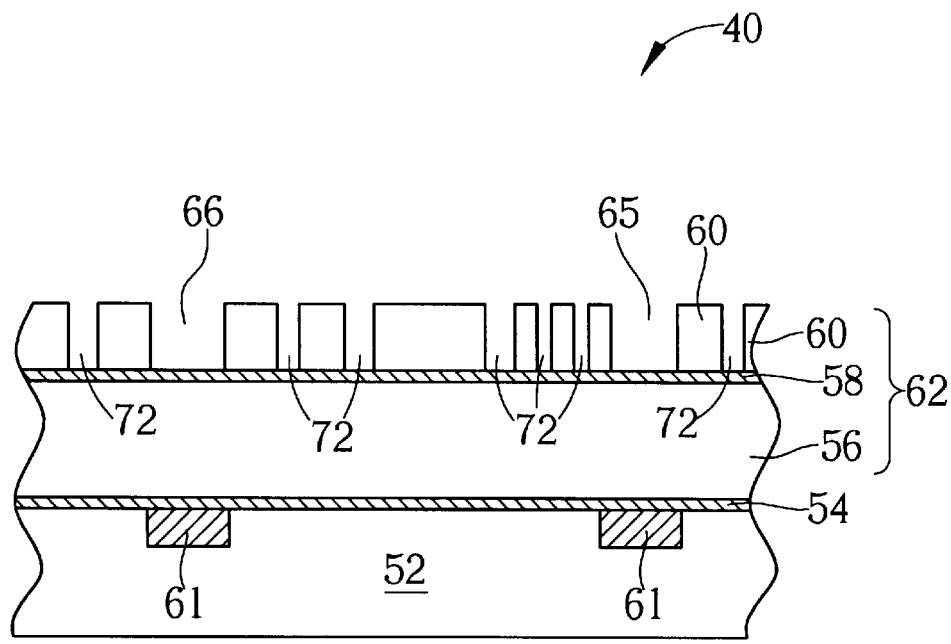
FIG. 2 shows the present invention after a dry etching process is performed.

Next, as shown in FIG. 2, a dry etching process is performed to transfer the pattern of the via holes 63, 64 and the trenches 71 in the photoresist layer 42 to the dielectric layer 60. In the dry etching process, the photoresist layer 42 and the etching stop layer 58 serve as a hard mask and an end-point layer, respectively. Via hole patterns 65, 66, and a plurality of trenches with an aspect ratio greater than 3.5, are formed in the dielectric layer 60. The via hole patterns 65, 66 are directly above the copper conductors 61.

Figure 3:
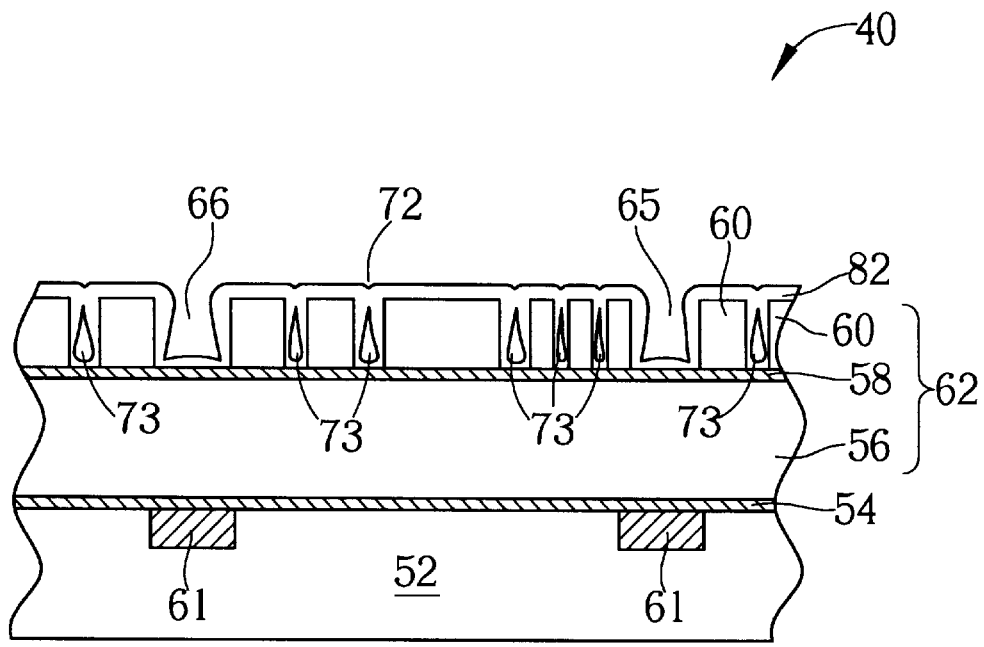
FIG. 3 is a cross-sectional view of the present invention after a series of cleaning and drying processes are performed, and an insulating layer is deposited on the surface of the dielectric layer.

Next, a series of cleaning and drying processes are performed to carefully remove particles and organic residue from the surface of the semiconductor wafer 40. As shown in FIG. 3, another CVD process is then performed to uniformly deposit an insulating layer 82 on the surface of the dielectric layer 60, the surface of the via hole patterns 65,66, and the surface of the trenches 72. The insulating layer 82 is composed of a low-dielectric constant material, such as silicon dioxide, PSG, BPSG, fluorinated silicon dioxide ($F_xSiO_y$), parylene, Teflon, amorphous carbon (a-C:F), etc.

By adjusting the parameters and conditions of the CVD process, the insulating layer 82 can be formed with different step coverage characteristics and different thicknesses. The insulating layer 82 forms overhangs on the dielectric layer 60 around the top edges of the openings of the trenches 72, and these overhangs close the trenches so as to form the voids 73.

Figure 4:
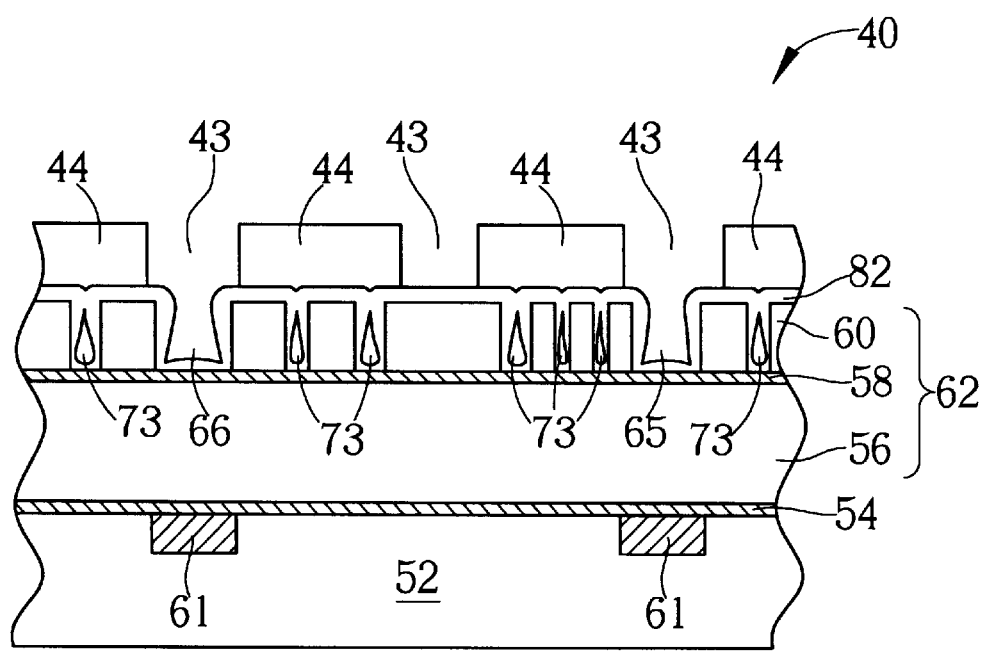
FIG. 4 shows the present invention after the coating of a photoresist layer.

Next, as shown in FIG. 4, an RCA standard cleaning procedure is performed on the surface of the semiconductor wafer 40 and a dehydration process is used to dry the surface of the semiconductor wafer 40. Then, a positive type photoresist layer 44 is coated on the surface of the semiconductor wafer 40. A soft bake procedure, with a temperature of 90 to 110° C., is performed for a period of about 60 seconds to remove the solvent in the photoresist layer 44. A lithographic process is used to define trench patterns 43 of the copper wiring lines 91, 92, 93.

Figure 5:
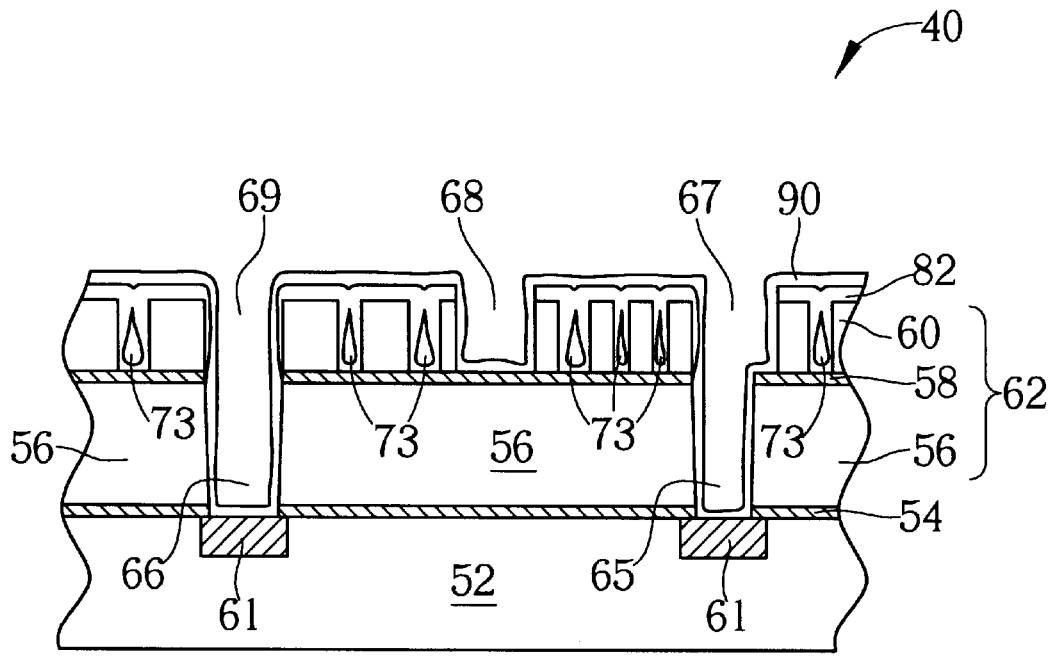
FIGS. 5 and 6 show the present invention after a reactive etching and subsequently, a photoresist stripping processes are performed.

As shown in FIG. 5, a reactive ion etching (RIE) process with fluoroform ($CHF_3$) as a reactive gas is then performed to vertically remove the portions of the insulating layer 82 and the dielectric layer 60 that are not covered by the photo resist layer 44 down to the surface of the etching stop layer 58. The trench pattern 43 is thus transferred to the dielectric layer 60 to form new trench patterns 67, 68, 69 in the dielectric layer 60. The via hole patterns 65, 66 are also transferred to the etching stop layer 58 and the silicon oxide layer 56 so as to expose the copper conductors 61. Subsequently, a photoresist stripping process is performed in an oxygen plasma environment to completely remove the photoresist layer 44.

In the preferred embodiment, the etching recipe for the RIE process should be carefully chosen to control the selectivity in the etching process. The etching stop layer 58 and the silicon oxide layer 56 are first etched down to the surface of the silicon nitride layer 54. Then a photoresist stripping process and a post-etching cleaning process are sequentially performed to remove polymer residues on the surface of the semiconductor wafer 40. A soft etching process is next performed to remove the silicon nitride layer 54 at the bottom of the via hole patterns 65, 66. This sequence of process steps is preferred, as copper has been reported to react with the plasma in the etching process to produce contaminants, such as cupric fluoride ($CuF_2$) and cupric oxide (CuO) The etching stops on the surface of the silicon nitride layer 54 prevent the underlying copper conductors from being etched during the RIE process.

Figure 6:
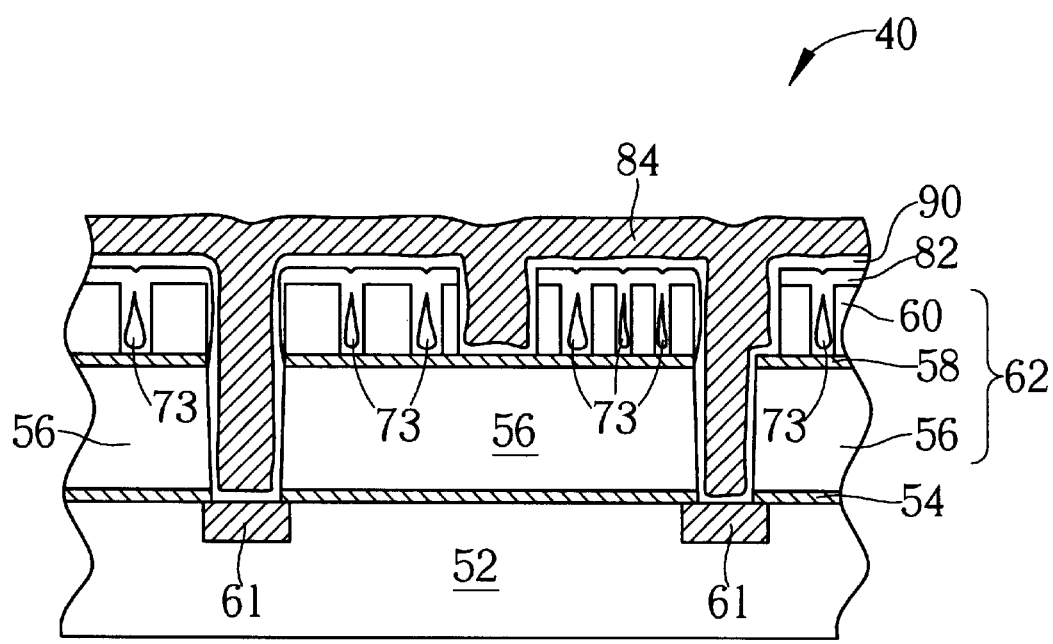

Next, as shown in FIG. 6, a copper layer 84 deposition process is performed. As noted before, copper diffuses rapidly through silicon and silicon dioxide. Additionally, copper does not adhere very well to the silicon oxide layer 56. As a result, a barrier layer 90 is usually formed before depositing the copper layer 84. The barrier layer 90 itself must possess good adhesive abilities to both the copper layer 84 and the silicon oxide layer 54, while serving as a barrier against the diffusion of copper. Currently, the mostly commonly used materials for the barrier layer 90 are tantalum (Ta), or tantalum nitride (TaN). Deposition of the tantalum nitride barrier layer 90 is performed in a mixture of $TaCl_5$ and hydrogen gasses at a temperature of about 700° C.

Optionally, a seed layer (not shown) is formed over the barrier layer 90 using a physical vapor deposition (PVD) process. Thereafter, the copper layer 84 is formed over the seed layer and fills the trench patterns 67, 68, 69 and the via hole patterns 65, 66. During the formation of the copper layer 84, additives can be added to achieve a bottom-up fill effect so as to increase the deposition rate at the bottom of the via hole over the deposition rate on the walls of the via hole. Thus, voids and seams can be avoided when filling the trench patterns 67, 68, 69 and via hole patterns 65, 66.

Figure 7:
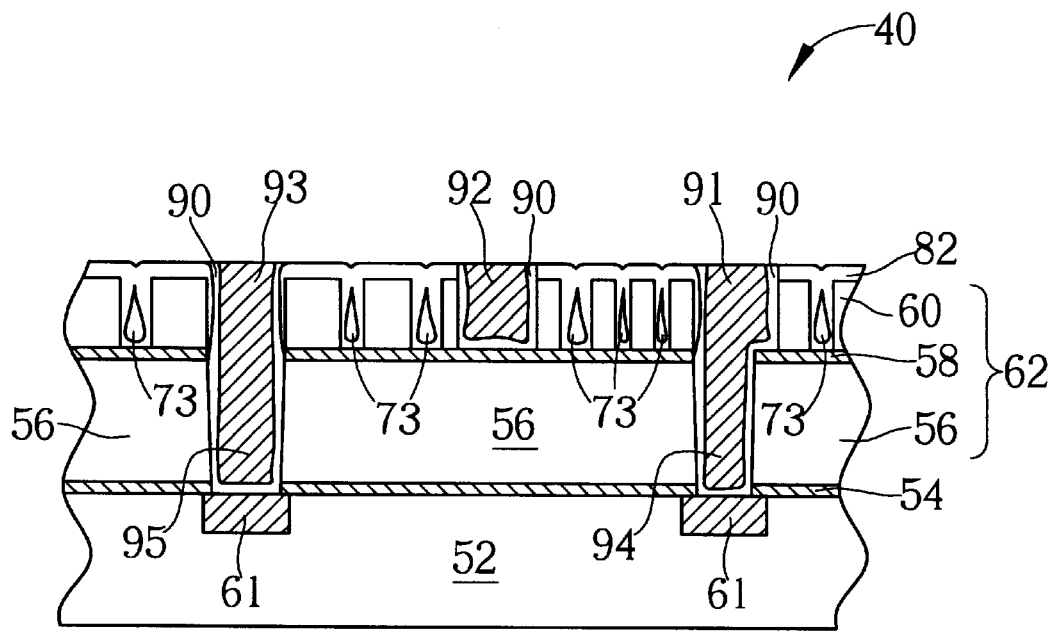
FIG. 7 shows the present invention after a chemical mechanical polishing (CMP) process is performed.

As shown in FIG. 7, a global planarization process, such as a chemical mechanical polishing (CMP) process, is then performed to remove the copper layer 84 down to the surface of the insulating layer 82 so as to form the copper wiring lines 91, 92, 93.

In general, the dual damascene process for copper interconnects usually suffers two problems: a) scratches and dishing effects are observed since copper is softer than aluminum; b) the significant difference between the polishing rate of the copper layer 84 and that of the barrier layer 90 further exacerbates the dishing effects and may lead to erosion of the copper wiring lines 91, 92, 93. The present invention solves these problems by using the insulating layer 82 as a sacrificial layer during the CMP process. The insulating layer 82 raises the copper layer 84 a distance that is equal to the thickness of the insulating layer 82. Thus the copper layer 84 over the insulating layer 82 can be completely removed and dishing effects can be avoided.

Figure 8:
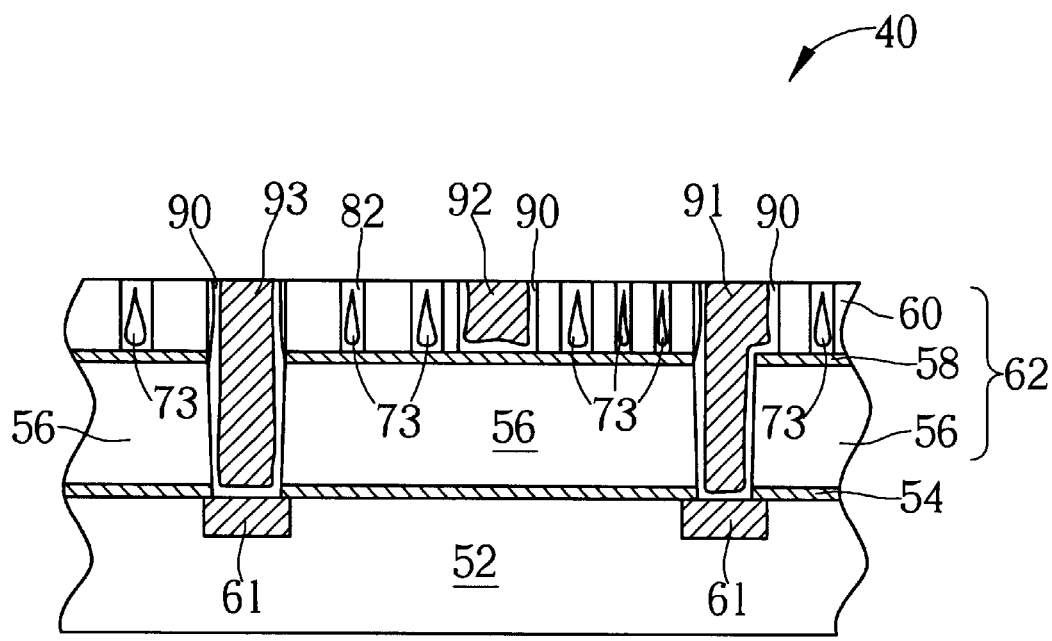
FIG. 8 shows the final product representative of the present invention.

Finally, as shown in FIG. 8, a second CMP process is used to remove the insulating layer 82 over the dielectric layer 60 and trenches 72, thereby completing the structure of the dielectric layer 60 between adjacent copper wiring lines 91, 92, 93.

In contrast to prior method of reducing RC time delays, the present invention provides a structure of a dielectric layer 60 between adjacent copper wiring lines 91, 92, 93, and it also solves dishing problems when performing a CMP during the dual damascene process. The effective dielectric constant is reduced due to the trenches 72 in the dielectric layer 60 and the voids formed in the trenches 72.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A dual damascene interconnect structure with reduced parasitic capacitance, the dual damascene interconnect structure comprising:

a stacked dielectric layer consisting of a first lower oxide layer, a second upper oxide layer, and a stop layer interposed between the first lower oxide layer and the second upper oxide layer;

two adjacent metal wiring lines damascened in the second upper oxide layer, wherein each metal wiring line is electrically connected by a metal plug damascened in the first lower oxide layer of the stacked dielectric layer;

a plurality of trenches formed in the second upper oxide layer between the two adjacent metal wiring lines; and an insulating layer deposited in the trenches so as to form a void in each of the trenches.

2. The structure of claim 1 wherein the metal wiring lines comprise copper (Cu).

3. The structure of claim 1 wherein the second upper oxide layer is composed of silicon oxide.

4. The structure of claim 1 wherein the aspect ratio of each of the trenches is greater than 3.5.

5. The structure of claim 1 wherein the insulating layer is comprises silicon dioxide, phosphosilicate glass (PSG), borophosphosilicate glass (BPSG), fluorinated silicon dioxide ($F_xSiO_y$), parylene, Teflon, or amorphous carbon (a-C:F).

6. A dual damascene structure, comprising:

a stacked dielectric layer comprising a bottom oxide layer and an upper oxide layer;

at least two adjacent Cu wiring lines damascened in the upper oxide layer, wherein each Cu wiring line is electrically connected by a Cu plug damascened in the bottom layer of the stacked dielectric layer;

at least one trench formed in the upper oxide layer between the two adjacent Cu wiring lines; and an insulating layer deposited in the trench so as to form a void in the trench.

7. The structure of claim 6 wherein the upper oxide layer is composed of silicon oxide.

8. The structure of claim 6 wherein each of the trenches has an aspect ratio that is greater than 3.5.

9. The structure of claim 6 wherein the insulating layer comprises silicon dioxide, phosphosilicate glass (PSG), borophosphosilicate glass (BPSG), fluorinated silicon dioxide ($F_xSiO_y$), parylene, Teflon, or amorphous carbon (a-C:F).

* * * * *